United States Patent [19]

Hagiwara

[11] Patent Number: 4,851,887
[45] Date of Patent: Jul. 25, 1989

[54] SOLID STATE IMAGER DEVICE

[75] Inventor: Yoshiaki Hagiwara, Kanagawa, Japan

[73] Assignee: Sony Corporation, Tokyo, Japan

[21] Appl. No.: 143,651

[22] Filed: Jan. 13, 1988

[30] Foreign Application Priority Data

Jan. 16, 1987 [JP] Japan .................................... 62-7655

[51] Int. Cl.$^4$ ..................... H01L 29/78; H01L 27/14; H01L 31/00; H01L 29/04
[52] U.S. Cl. ........................................ 357/24; 357/30; 357/59
[58] Field of Search .............................. 357/24, 30, 59

[56] References Cited

U.S. PATENT DOCUMENTS

| 4,369,458 | 1/1983 | Thomas et al. | 357/30 H |
| 4,737,833 | 4/1988 | Tabei | 357/24 LR |
| 4,740,824 | 4/1988 | Yano et al. | 357/24 LR |
| 4,748,486 | 5/1988 | Miyatake | 357/30 R |

Primary Examiner—Gene M. Munson

[57] ABSTRACT

A solid state imager device having a charge accumulating region of a second conductivity type formed on the surface side of a semiconductor substrate of a first conductivity type which has a charge accumulating region of the second conductivity type laminated on the charge accumulating region, the second conductivity type region and the charge accumulating region forming a charge accumulating section, and a first conductivity type region formed on the surface of and/or on the side of the second conductivity type region, wherein if an excessive signal charge is produced in the charge accumulating section, the excessive signal charge is absorbed in the first conductivity type region, whereby brooming can be satisfactorily suppressed and higher integration of the device can be achieved.

1 Claim, 12 Drawing Sheets

SOLID STATE IMAGER DEVICE

BACKGROUND OF THE INVENTION

1. Field of the Invention

This invention relates to a solid state imager device.

2. Description of the Prior Art

There has conventionally been proposed a solid state imager device as shown in FIG. 1.

In FIG. 1, there is formed on the surface of a P-type silicon substrate 1 a charge accumulating region 2 made of an $N^-$-type region, an overflow control gate region 3 made of a P-type region adjacent to the charge accumulating region 2, and an overflow drain region 4 made of an $N^+$-type region adjacent to the overflow control region 3. Reference numeral 5 designates a channel stopper region, 6 a charge transfer region made of an $N^{31}$-type region, 7 a transfer electrode made of polycrystalline silicon, and 8 and 9 $SiO_2$ layers, respectively.

The above-mentioned solid state imager device is generally referred to as a lateral overflow-structured solid state imager device. When excessive signal charges are produced due to the irradiation of intense light, they are drawn out from the charge accumulating region 2 through the overflow control gate region 3 to the overflow drain region 4 and consequently absorbed in the overflow drain region 4. Therefore, the imager device having such structure can satisfactorily remove brooming.

However, since solid state imager device of the lateral overflow structure is such that the overflow control gate region 3 and the overflow drain region 4 are juxtaposed adjacent to the charge accumulating region 2 on the surface of the P-type silicon substrate 1, a dimension or area per one pixel is increased by these regions, so that high integration of the imager device cannot be achieved.

There has also been proposed a so-called vertical overflow-structured solid state imager device as shown in FIG. 2. In such an imager device, a P-type diffusion region 11 is deposited on the surface of an N-type silicon substrate 10, and the charge accumulating region 2 made of an $N^{31}$-region is formed on the surface of the P-type diffusion region 11. When excessive signal charges are produced, they are drawn out through the P-type diffusion region 11 positioned directly below the charge accumulating region 2 to the N-type silicon substrate 10 and absorbed in the N-type silicon substrate 10. The imager device of such, vertical overflow structure can also satisfactorily remove brooming, similar to the aforementioned that of the lateral overflow structure.

However, the solid state imager device of the vertical overflow structure has difficulty in forming the P-type diffusion region 11, so that its manufacturing process is quite restricted.

OBJECTS AND SUMMARY OF THE INVENTION

Accordingly, it is an object of the present invention to provide a solid state imager device which is capable of removing the above-mentioned inconvenience encountered in the prior art.

To achieve the above object, the present invention provides a solid state imager device having a charge accumulating region of a second conductivity type formed on the surface side of a semiconductor substrate of a first conductivity type, comprising:

(a) a charge accumulating section of the second conductivity type formed on the charge accumulating region, the second conductivity type region and the charge accumulating region, forming a charge accumulating section; and (b) a first conductivity type region formed on the surface of and/or on the side of the second conductivity type region, wherein if an excessive signal charge is produced in the charge accumulating section, the excessive signal charge is absorbed in the first conductivity type region.

These and other objects, feature and advantages of the present invention will become apparent from the following detailed description of the preferred embodiment taken in conjunction with the accompanying drawings, throughout which like reference numerals designate like elements and parts.

DESCRIPTION OF THE PREFERRED EMBODIMENT

Figure 1:
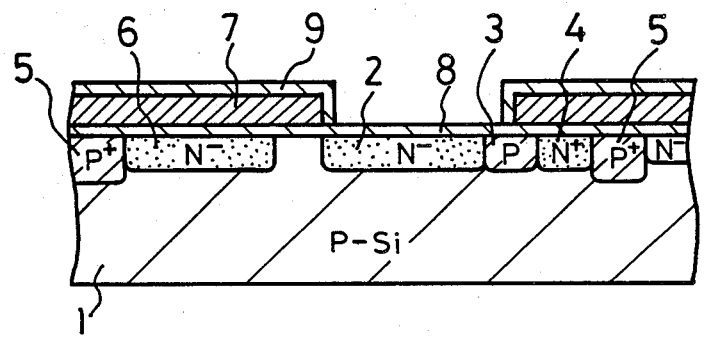
FIG. 1 is a cross-sectional view showing a main portion of an example of a previously proposed solid state imager device.
Figure 2:
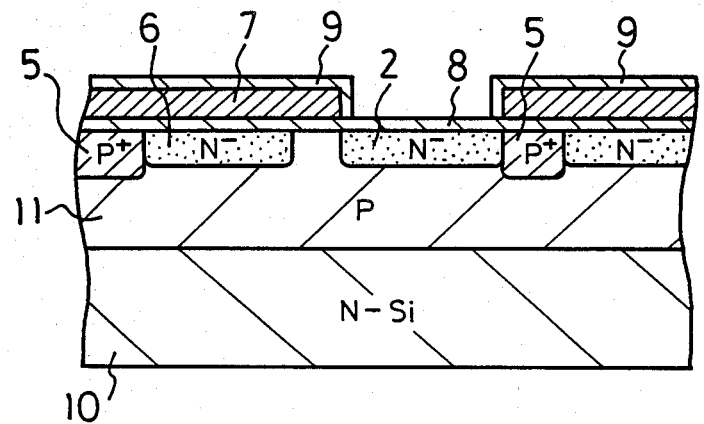
FIG. 2 is a cross-sectional view showing a main portion of another example of a previously proposed solid state imager device.

An embodiment of a solid state imager device according to the present invention will hereinafter be described with reference to FIGS. 3 to 23. The description is given to a case where the present invention is applied to a solid state imager device which employs the interline transfer system. The parts in FIGS. 3–23 corresponding to those in FIGS. 1 and 2 are designated by the same reference numerals.

Figure 3:
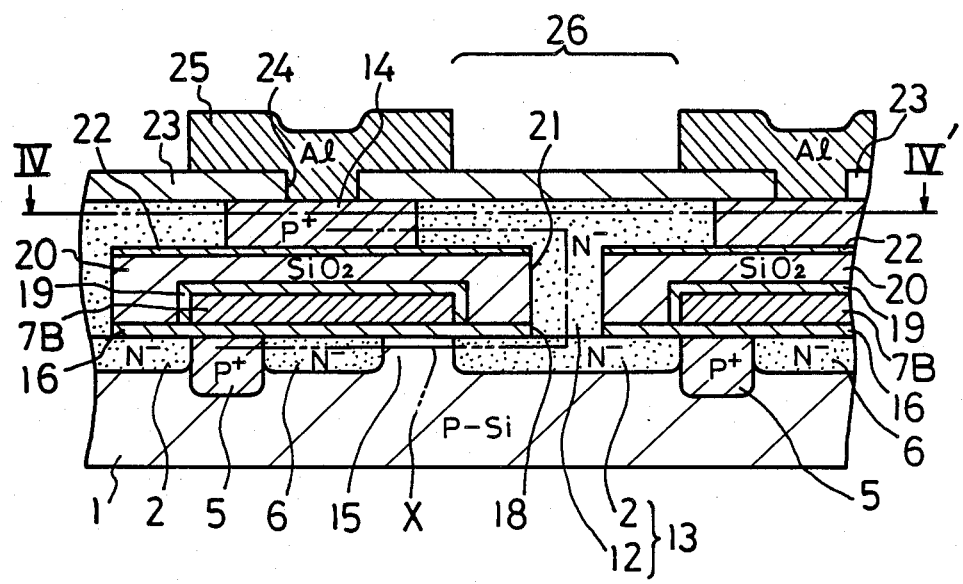
FIG. 3 is a cross-sectional view showing a main portion of an embodiment of a solid state imager device according to the present invention.
Figure 5:
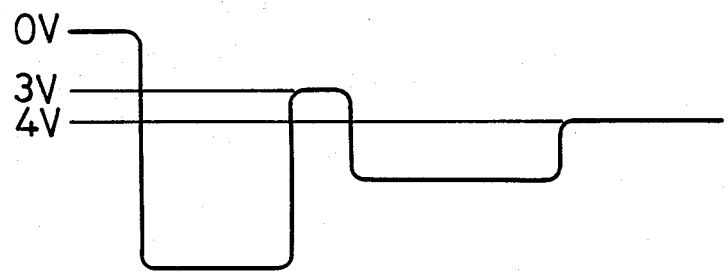
FIG. 5 is a graph showing the potential level of the respective parts of the solid state imager device shown in FIG. 3.
Figure 4:
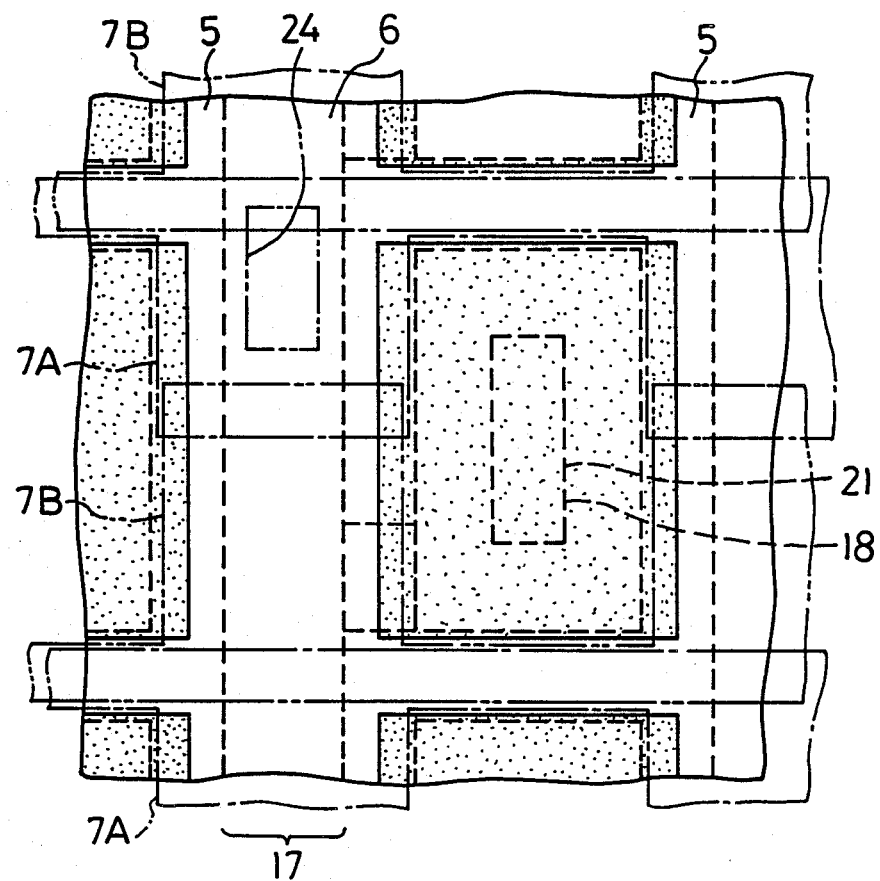
FIG. 4 is a top plan view taken along a line IV—IV' of FIG. 3.

First, the structure of the present embodiment is explained with reference to FIGS. 3 to 5.

On the surface of a P-type silicon substrate 1, there are formed an $N^-$-type region 2 serving as a charge accumulating region, an $N^-$-type region 6 sering as a charge transfer region and a $P^+$-type region 5 serving as a channel stopper region, respectively. In this case, there are provided, for example, horizontally 492 and vertically 800 of the $N^-$-type regions 2 in the form of a matrix.

Transfer electrodes 7A and 7B are formed on the charge transfer region 6 through an $SiO_2$ layer 16. These transfer electrodes 7A and 7B and the charge transfer electrode 6 form a vertical register section 17 which is operative to transfer signal charges read out of the charge accumulating region 2 to a horizontal register section (not shown) by a so-called four phase drive. The transfer electrodes 7A and 7B are respectively made of polycrystalline silicon doped with impurities to reduce their resistances. Further, the transfer electrodes 7A and 7B extend over a read-out gate region 15 on the P-type silicon substrate 1 so as to be used also as the read-out gate region 15. The $SiO_2$ layer 16 is provided, on the charge accumulating region 2, with a rectangular opening 18 which is smaller than the charge accumulating region 2 in area. An output section and the horizonatal register section are constructed in a known manner, though not shown in FIGS. 3 and 4.

Further, there are deposited an $SiO_2$ layer 19 over the transfer electrodes 7A and 7B and also an $SiO_2$ layer 20 over the $SiO_2$ layers 19 and 16. An opening 21 is provided through the $SiO_2$ layer 20 which is coincident with the opening 18 through the $SiO_2$ layer 16. A light shielding layer 22 is provided on the upper surface of the $SiO_2$ layer 20 to protect the vertical register section 17 from irradiation to thereby prevent a so-called smear.

An $N^-$-type region 12 extending over the light shielding layer 22 on the $SiO_2$ layer 20 through the opening 18 and the opening 21 of the $SiO_2$ layer 20 is deposited by the epitaxial growth tecniques. The $N^{31}$-type regions 12 and 2 form a change accumulating section 13. The dimension or area of the upper surface of the $N^-$-type region 12 is made a bit larger than the dimension or area of the $N^-$-type region 2.

A $P^+$-type region 14 is provided on the side surface of the $N^-$-type region 12 to form a PN junction with the $N^-$-type region 12. The $P^+$-type region 14 is provided on the surface thereof with an $SiO_2$ layer 23 serving as a protective layer through which formed is an opening 24 which is positioned on the $P^+$-type region 14. An alminum wiring layer 25 which is connected in ohmic with the $P^+$-type region 14 through the opening 24 is deposited on the $SiO_2$ layer 23 such that it does not shield a light receiving face 26.

In this embodiment, the channel stopper region 5 is made, for example, at zero volt, and the read out gate region 15, for example, at three volts. The $P^+$-type region 14 is supplied, for example, with direct-current four volts through the alminum wiring layer 25. The potential level in a region indicated by a two-dot chain line X in FIG. 3, that is, in the region over the channel stopper region 5, the charge transfer region 6, the read-out gate region 15, the $N^-$-type region 2, the $N^-$-type region 12 and the $P^+$-type region 14, is made as shown in FIG. 5. To be specific, the $P^+$-type region 14 has a deeper potential level than that of the read-out gate region 15.

Next, how the solid state imager device of the present embodiment is manufactured will be explained with reference to FIGS. 6 to 23. However, the explanation is limited to only the parts shown in FIGS. 3 and 4.

Figure 6:
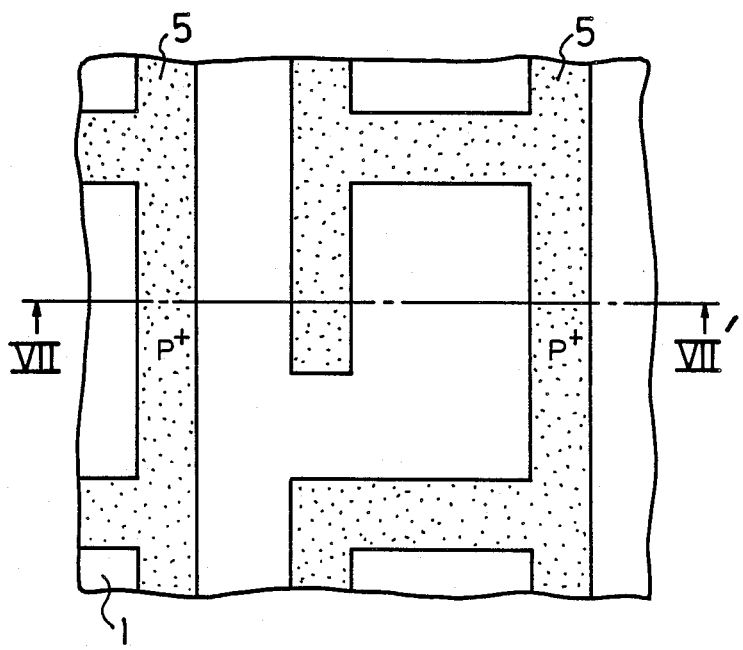
FIGS. 6, 8, 10, 12, 14, 16, 18, 20 and 22 are partial plan views respectively showing a manufacturing process of the solid state imager device shown in FIG. 3.
Figure 7:
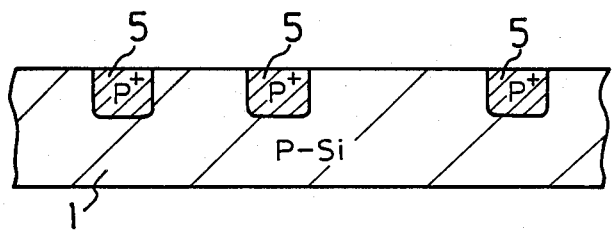
FIG. 7 is a cross-sectional view taken along a line VII—VII' of FIG. 6.

Referring first to FIGS. 6 and 7, the P-type silicon substrate 1 is prepared and then selectively ion-implanted with P-type impurities to form the $P^+$-type region 5 which is to serve as a channel stopper region.

Figure 8:
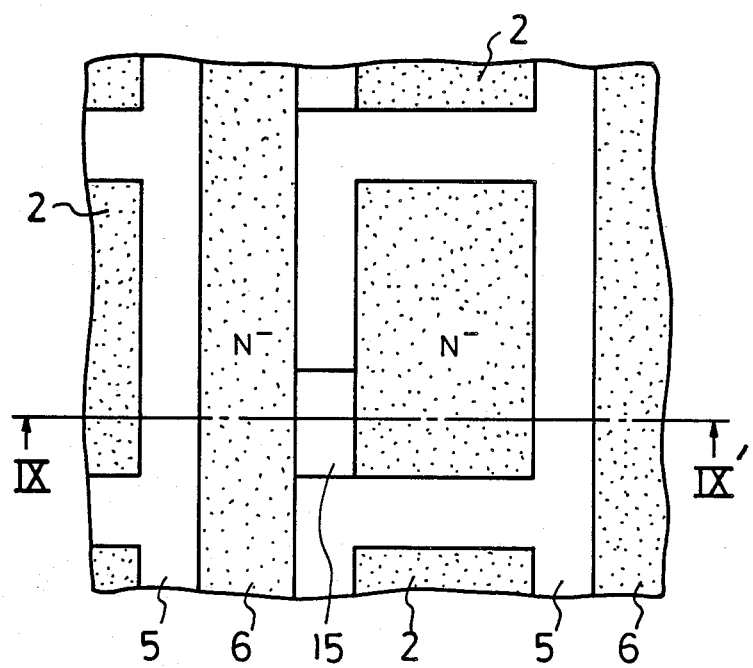
Figure 9:
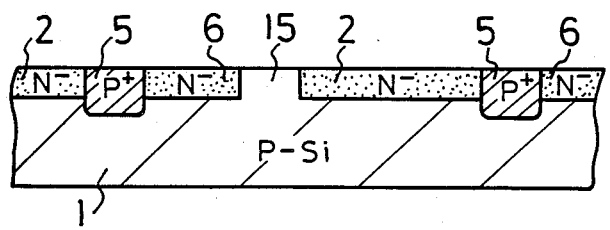
FIG. 9 is a cross-sectional view taken along a line IX—IX' of FIG. 8.

Next, as shown in FIGS. 8 and 9, the P-type silicon substrate 1 is selectively ion-implanted with N-type impurities to form the $N^-$-type region 2 serving as the charge accumulating region and the $N^-$-type region 6 serving as the charge transfer region.

Figure 10:
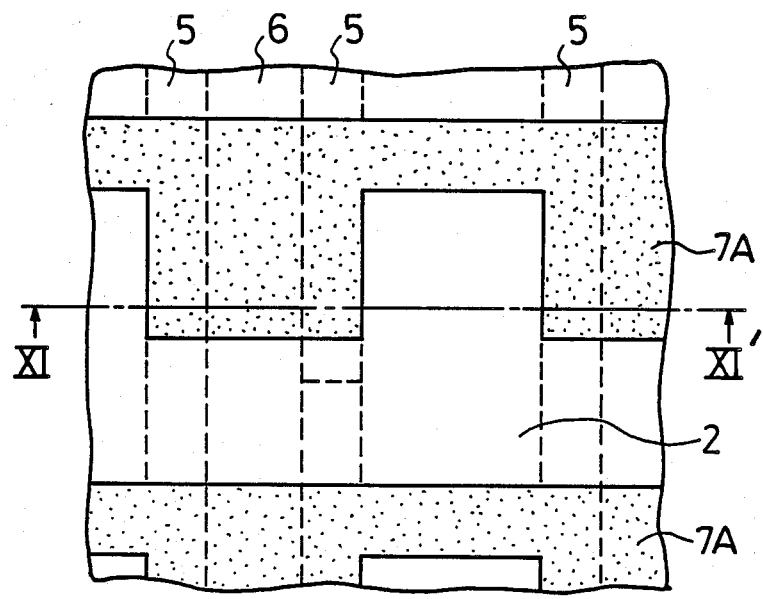
Figure 11:
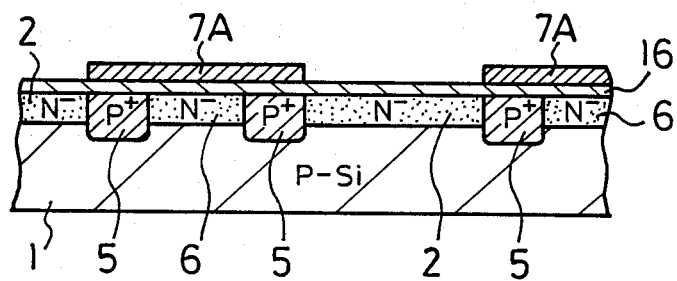
FIG. 11 is a cross-sectional view taken along a line XI—XI' of FIG. 10.

Next, as shown in FIGS. 10 and 11, the $SiO_2$ layer 16 is deposited all over the upper surface of the device shown in FIG. 9, for example, by chemical vapor deposition (CVD) techniques, and then the transfer electrode 7A made of polycrystalline silicon is formed on the $SiO_2$ layer 16.

Figure 12:
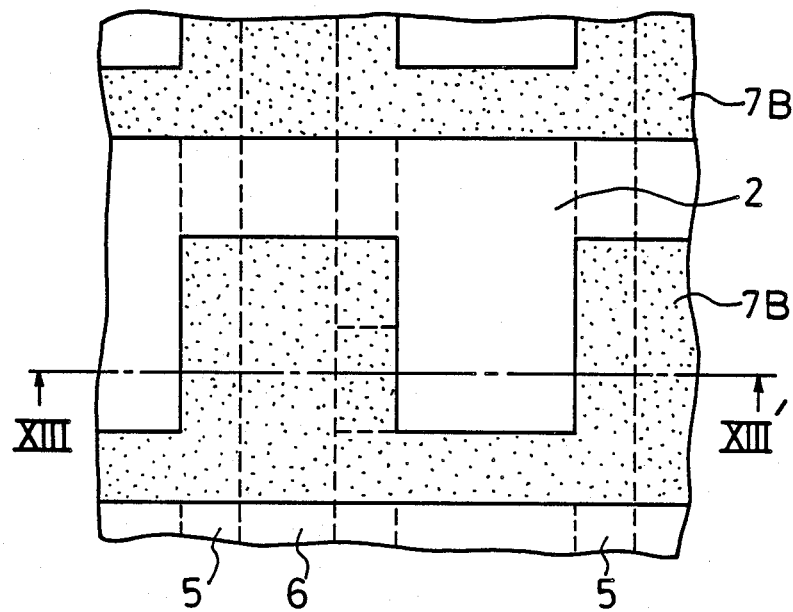
Figure 13:
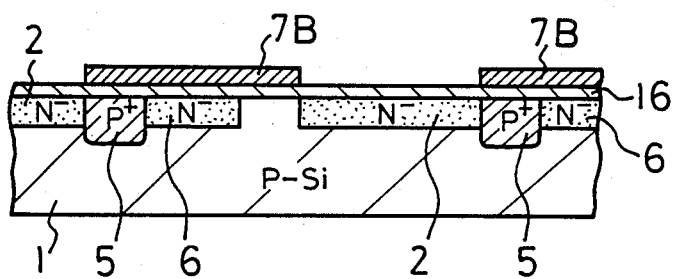
FIG. 13 is a cross-sectional view taken along a line XIII—XIII' of FIG. 12.

Next, after forming an inter-layer insulating layer on the transfer electrodes 7A, the transfer electrode 7B which serves also as the read-out gate is formed with polycrystalline silicon, as shown in FIGS. 12 and 13.

Figure 14:
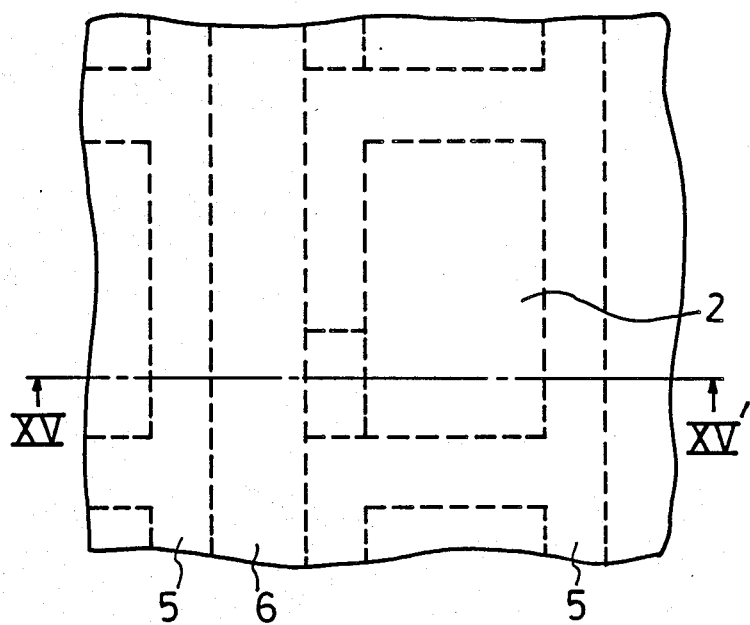
Figure 15:
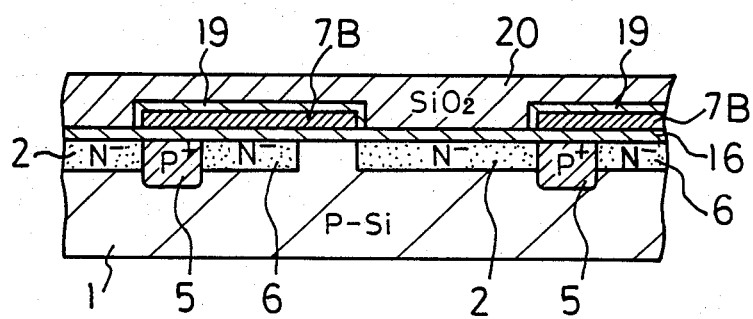
FIG. 15 is a cross-sectional view taken along a line XV—XV' of FIG. 14.

Next, as shown in FIGS. 14 and 15, the transfer electrode 7B is covered with the $SiO_2$ layer 19 formed by the thermal oxidation. Then, the $SiO_2$ layer 20 is deposited all over the surface thereof by the CVD techniques.

Figure 16:
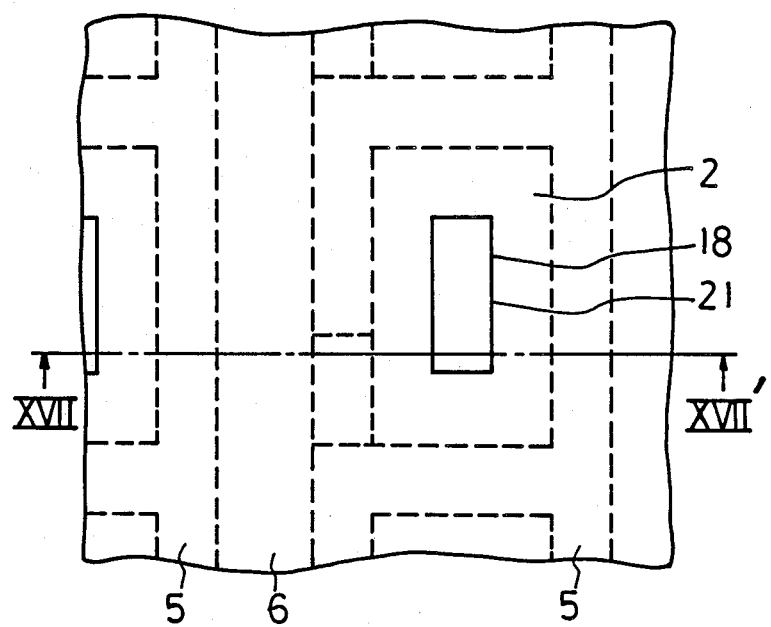
Figure 17:
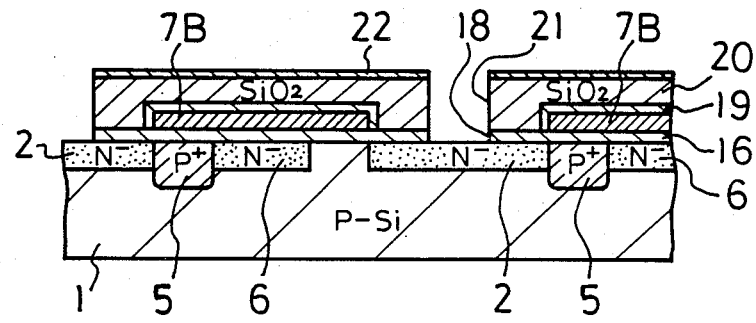
FIG. 17 is a cross-sectional view taken along a line XVII—XVII' of FIG. 16.

Next, as shown in FIGS. 16 and 17, the rectangular-shaped openings 18 and 21 smaller than the charge accumulating region 2 in area are provided through the $SiO_2$ layers 16 and 20 on the charge accumulating region 2. Then, the light shielding layer 22 made of light reflective or light absorbing material is deposited on the $SiO_2$ layer 20.

Figure 18:
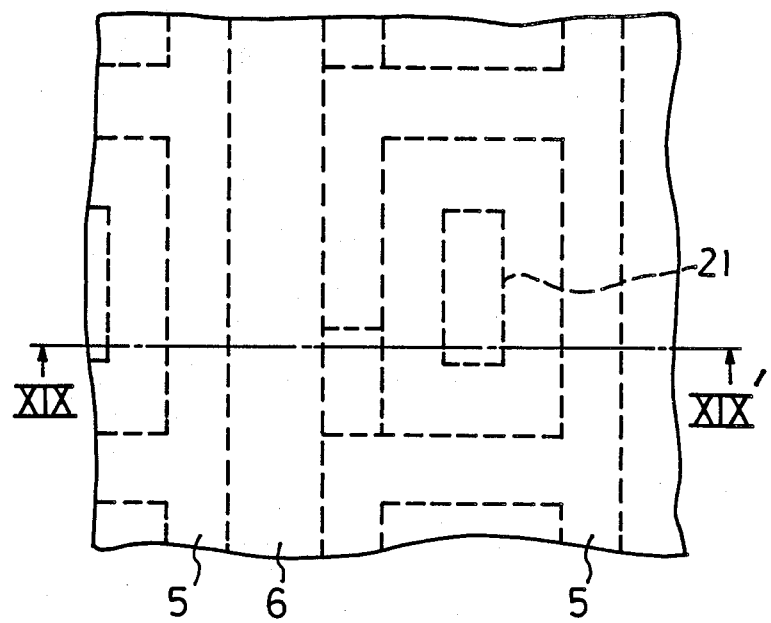
Figure 19:
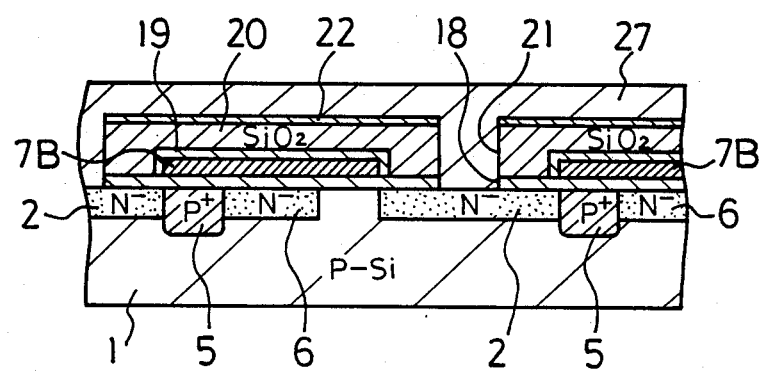
FIG. 19 is a cross-sectional view taken along a line XIX—XIX' of FIG. 18.

Next, as shown in FIGS. 18 and 19, a silicon layer 27 is deposited on all the surface of the device shown in FIG. 17, with the surface of the $N^-$-type region 2 exposed by the openings 18 and 21 used as a seeding crystal.

Figure 20:
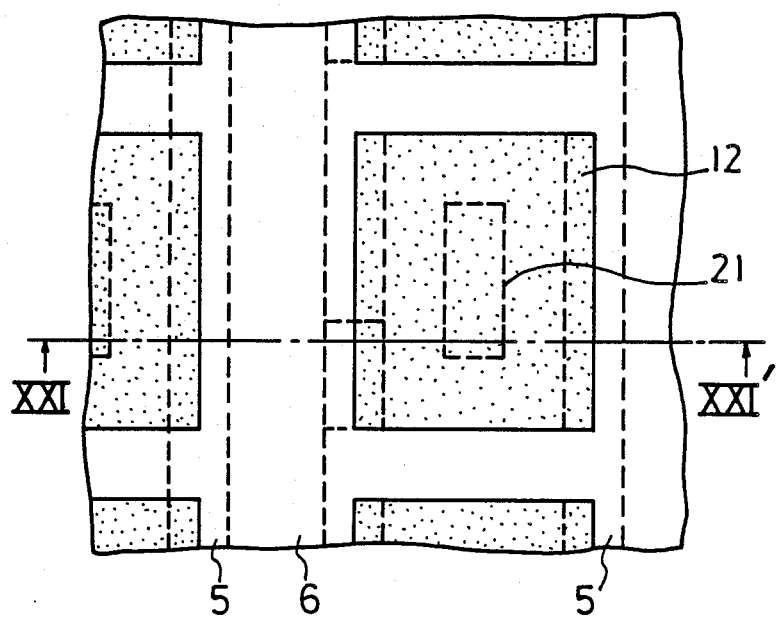
Figure 21:
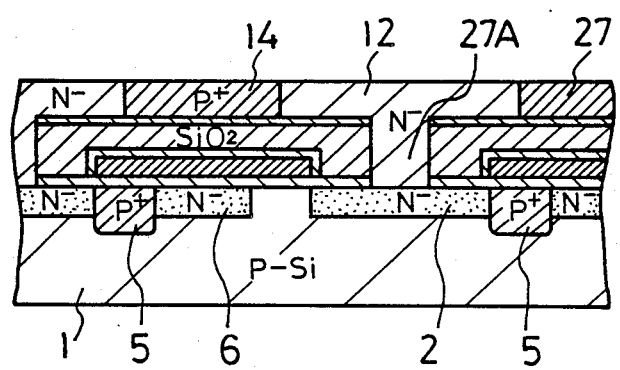
FIG. 21 is a cross-sectional view taken along a line XXI—XXI' of FIG. 20.

Next, as shown in FIGS. 20 and 21, the silicon layer 27 is selectively ion-implanted with N-type impurities and P-type impurities to form the $N^-$-type region 12, whose center portion is a silicon layer 27A in the openings 18 and 21 and whose upper plane portion is a bit wider than that of the $N^-$-type region 2, and the $P^+$-type region 14 occupies portions other than the $N^-$-type region 12.

Figure 22:
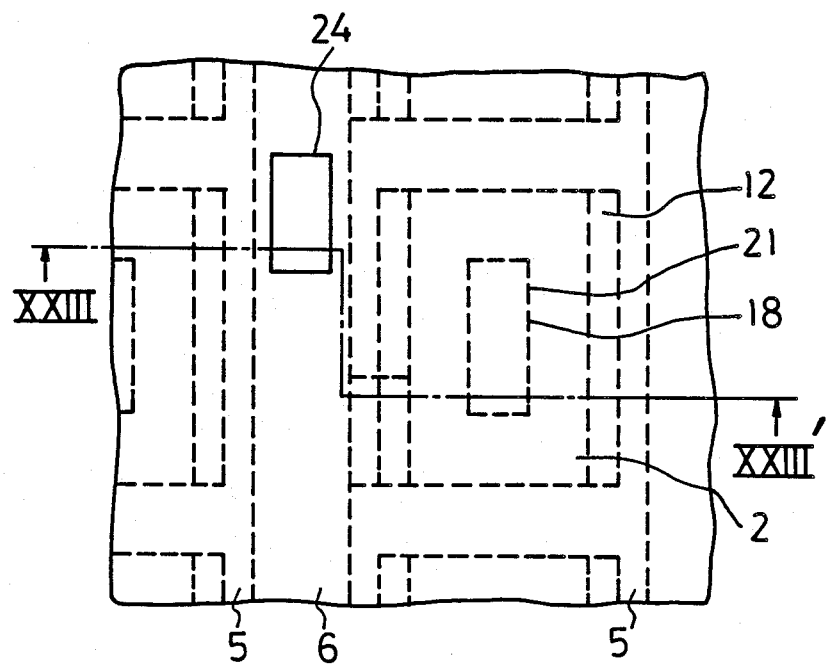
Figure 23:
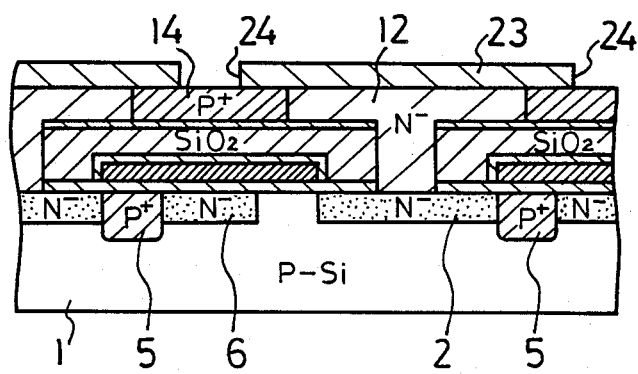
FIG. 23 is a cross-sectional view taken along a line XXIII—XXIII' of FIG. 22.

Next, as shown in FIGS. 22 and 23, the $SiO_2$ layer 23 is deposited all over the surface of the $N^-$-type region 12 and the $P^+$-type region 14 by the CVD techniques. Then, the opening 24 is formed at a predetermined position of the $SiO_2$ layer 23 on the $P^+$-type region 14.

Next, the aluminum wiring layer 25 which is ohmically connected with the $P^+$-type region 14 through the opening 24 is deposited on the $SiO_2$ layer 23 such that it does not shield the light receiving face 26. Finally, the alminum wiring layer 25 is treated to be applied, for example, with direct-current four volts, whereby the solid state imager device of the present embodiment shown in FIG. 3 is completed.

Signal charges produced when the light receiving face 26 is irradiated with light are accumulated in the charge accumulating section 13 formed of the $N^-$-type regions 2 and 12 and ordinally read out to the vertical register section 17 through the read-out gate region 15.

On the other hand, if signal charges exceeding the capacity of the charge accumulating section 13 are produced by intense light irradiating the light receiving face 26, since the potential level of the $P^+$-type region 14 is made lower than that of the gateregion 15, the excessive signal charges never flow into other charge accumulating regions but are drawn out to the P+-type region 14. In this case, the P+-type region 14 and the N−-type region 12 form the PN junction and holes exist in the P+-type region 14 as the majority carrier, so that the signal charges (electrons) drawn to the P+-type region 14 are recombined with the holes in the P+-type region 14. Thus, brooming can be satisfactorily removed.

According to the present embodiment, it is not necessary to provide the region, to which excessive signal charges are discharged, on the surface of the semiconductor substrate adjacent to the charge accumulating region as the lateral overflow-structured solid state imager device, so that a dimension or area per one pixel can be reduced, whereby high integration can be achieved.

Also, in this invention it is not necessary to form on the N-type silicon substrate the P-type diffusion region which has difficulty in forming conditions, as the vertical overflow-structured solid state imager device, so that the manufacture thereof becomes more easily.

The above-described embodiment is the case where the present invention is applied to an interline transfer solid state imager device. Apart from that, the present invention can be also applied to a MOS-type solid state imager device, wherein the same effects as described above can be achieved.

The above description is given on a single preferred embodiment of the invention but it will be apparent that many modifications and variations could be effected by one skilled in the art without departing from the spirits or scope of the novel concepts of the invention so that the scope of the invention should be determined by the appended claim only.

I claim as my invention:

1. A solid state imager device having a charge accumulating region of a second conductivity type formed on the surface side of a semiconductor substrate of a first conductivity type, comprising:
    (a) a charge accumulating section of the second conductivity type formed on said charge accumulating region, said second conductivity type region and said charge accumulating region, forming a charge accumulating section; and
    (b) a first conductivity type region formed on the surface of and/or on the side of said second conductivity type region, wherein if an excessive signal charge is produced in said charge accumulating section, said excessive signal charge is absorbed in said first conductivity type region.

* * * * *